(12) United States Patent
Gendai

(10) Patent No.: US 9,559,641 B2
(45) Date of Patent: Jan. 31, 2017

(54) CURRENT MIRROR, CONTROL METHOD, AND IMAGE SENSOR

(71) Applicant: Sony Corporation, Tokyo (JP)

(72) Inventor: Yuji Gendai, Kanagawa (JP)

(73) Assignee: Sony Corporation, Tokyo (JP)

( * ) Notice: Subject to any disclaimer, the term of this patent is extended or adjusted under 35 U.S.C. 154(b) by 57 days.

(21) Appl. No.: 14/626,660

(22) Filed: Feb. 19, 2015

(65) Prior Publication Data

US 2015/0244332 A1    Aug. 27, 2015

(30) Foreign Application Priority Data

Feb. 26, 2014   (JP) ................... 2014-034956

(51) Int. Cl.
*H04N 5/369*   (2011.01)
*H03F 3/08*   (2006.01)
*H04N 5/378*   (2011.01)

(52) U.S. Cl.
CPC ............ *H03F 3/082* (2013.01); *H04N 5/3698* (2013.01); *H04N 5/378* (2013.01)

(58) Field of Classification Search
CPC ........ H03F 3/082; H04N 5/3698; H04N 5/378
See application file for complete search history.

(56) References Cited

U.S. PATENT DOCUMENTS

| | | | | |
|---|---|---|---|---|
| 6,897,429 B1* | 5/2005 | Turner | ............... | H04N 5/23241 250/208.1 |
| 7,145,379 B2* | 12/2006 | Date | .................... | G09G 3/3283 327/431 |
| 7,262,652 B2* | 8/2007 | Omori | ................. | G09G 3/3283 327/108 |
| 7,659,500 B2* | 2/2010 | Purcell | ............... | H04N 5/23241 250/208.1 |
| 8,149,309 B2* | 4/2012 | Tanaka | ................... | H04N 5/335 348/300 |
| 8,159,586 B2* | 4/2012 | Yoshida | ............... | H04N 3/1568 348/308 |
| 8,665,352 B2* | 3/2014 | Maeda | ................. | H04N 5/3456 250/208.1 |
| 8,742,736 B2* | 6/2014 | Myers | ..................... | H03F 1/301 323/265 |
| 9,030,586 B2* | 5/2015 | Gendai | .................. | H04N 5/335 348/294 |
| 2012/0153131 A1* | 6/2012 | Ishimoto | ............... | H04N 5/378 250/208.1 |

FOREIGN PATENT DOCUMENTS

JP    03-159410 A    7/1991

* cited by examiner

*Primary Examiner* — Jeffrey Zweizig
(74) *Attorney, Agent, or Firm* — Sheridan Ross P.C.

(57) ABSTRACT

There is provided a current mirror that includes at least one bias amplifier configured to adjust a gate line voltage by feeding currents to the gate line to make constant gate-source voltages of a plurality of FETs (Field Effect Transistors), the gate line connecting gates of the FETs each being a load component in the current mirror.

8 Claims, 10 Drawing Sheets

CURRENT MIRROR, CONTROL METHOD, AND IMAGE SENSOR

CROSS REFERENCE TO RELATED APPLICATIONS

This application claims the benefit of Japanese Priority Patent Application JP 2014-034956 filed Feb. 26, 2014, the entire contents of which are incorporated herein by reference.

BACKGROUND

The present disclosure relates to current mirrors, control methods, and image sensors and, more specifically, to a current mirror, a control method, and an image sensor with which any influence of the spatial distribution of GND (ground) potential or power supply potential may be reduced.

In a current mirror, a mirror current flows in a load transistor to which a current is mirrored. The mirror current is proportional to a reference current that flows in a driver transistor from which a current is mirrored. A ratio between the reference current and the mirror current is referred to as mirror ratio.

For a current mirror with an extremely high mirror ratio, e.g., a large-load current mirror, what is important is to enhance the driving capability of the driver transistor, i.e., to reduce the output impedance of the driver transistor. For reducing the output impedance of the driver transistor, an effective method is to configure the current mirror with FETs (Field Effect Transistors), and to configure the driver transistor as an SF (Source Follower) transistor.

The SF current mirror is described in Japanese Patent Application Laid-Open Publication No. Hei 3-159410, for example.

SUMMARY

In a large-load current mirror, a load transistor may be a large number of FETs each being a load, for example. In such a current mirror, the load FETs are spatially distributed, and this thus increases the length of a GND (ground) line connected to a GND terminal or GND terminals.

When the FETs in the current mirror are each an nMOS (negative channel Metal Oxide Semiconductor) FET, a current flows from the load FETs into the above-mentioned long GND line. This causes a phenomenon of increasing the GND potential on the GND line as the GND line is spatially away from the GND terminal(s).

With the spatial distribution of the GND potential as above, when any of the load FETs is away from the GND terminal(s), the FET is reduced in gate-source voltage $V_{GS}$, and the mirror current flowing therein is reduced.

Note that when the FETs in the current mirror are each a pMOS (positive channel MOS) FET, a phenomenon similar to the above occurs to the spatial distribution of power supply potential.

It is thus desirable to reduce, in a current mirror, any influence of the spatial distribution of the GND potential or the power supply potential.

According to an embodiment of the present disclosure, there is provided a current mirror that includes at least one bias amplifier configured to adjust a gate line voltage by feeding currents to the gate line to make constant gate-source voltages of a plurality of FETs (Field Effect Transistors), the gate line connecting gates of the FETs each being a load component in the current mirror.

According to another embodiment of the present disclosure, there is provided a current mirror control method that includes adjusting a gate line voltage by feeding currents to the gate line to make constant gate-source voltages of a plurality of FETs, the gate line connecting gates of the FETs each being a load component in the current mirror.

According to still another embodiment of the present disclosure, there is provided an image sensor that includes a pixel unit performing photoelectric conversion, and a current mirror. The current mirror includes a plurality of load FETs each being a current source for an amplifier transistor, the amplifier transistor configuring an SF (Source Follower) in the pixel unit, and at least one bias amplifier configured to adjust a gate line voltage by feeding currents to the gate line to make constant gate-source voltages of a plurality of FETs, the gate line connecting gates of the FETs each being a load component in the current mirror.

In the embodiments of the present disclosure, a gate line is biased by a current being fed to the gate line connecting gates of a plurality of FETs each being a load component in the current mirror, thereby making constant a gate-source voltage of the FETs.

Herein, the current mirror may be an independent device, or may be an internal block in a device.

According to the embodiments of the present disclosure, in a current mirror, any influence of the spatial distribution of GND potential or power supply potential may be reduced.

While the effects have been described herein, the foregoing description is in all aspects illustrative and not restrictive. It is understood that any one of numerous other effects described in the present disclosure may be produced.

These and other objects, features and advantages of the present disclosure will become more apparent in light of the following detailed description of best mode embodiments thereof, as illustrated in the accompanying drawings.

DETAILED DESCRIPTION OF EMBODIMENT

[Digital Camera in Embodiment with Application of Present Disclosure]

Figure 1:
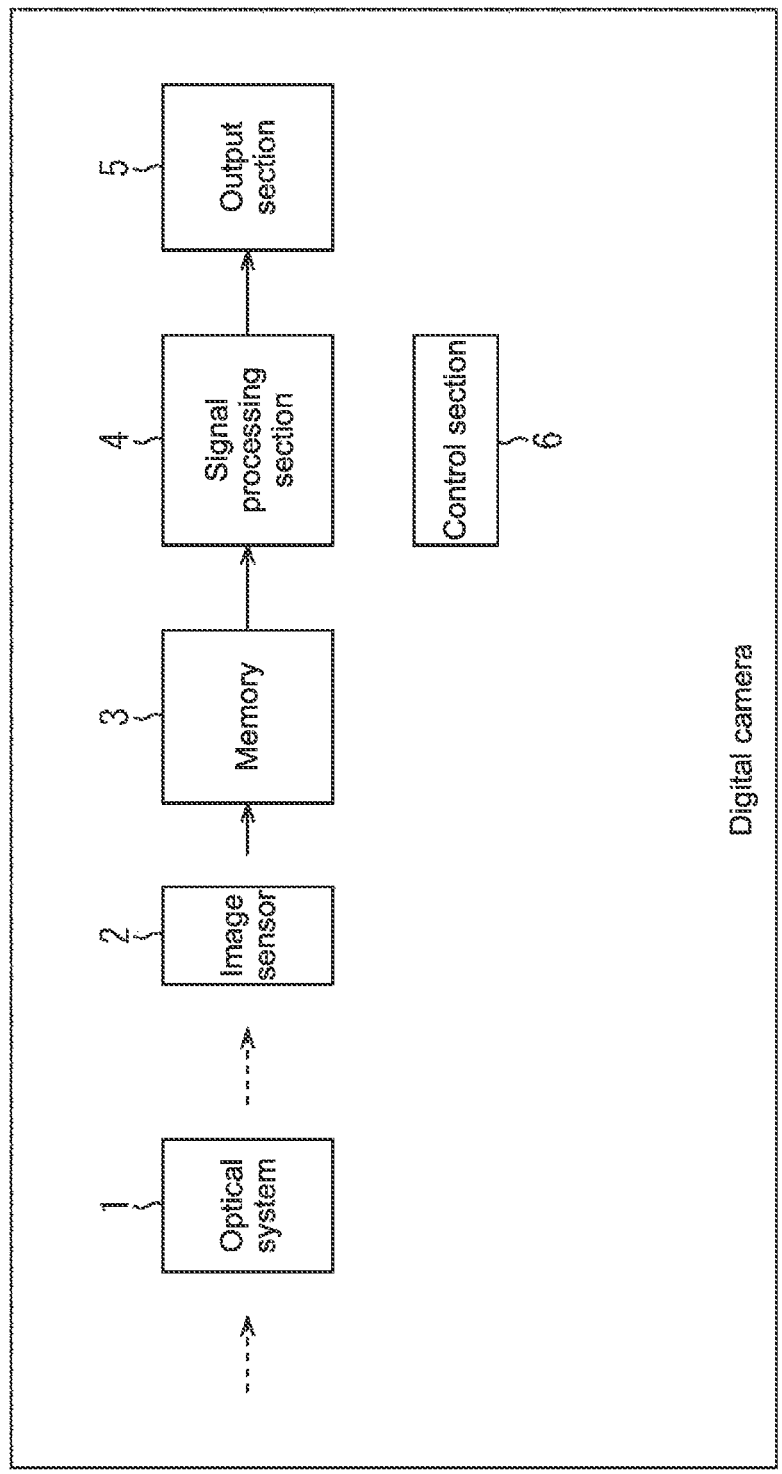
FIG. 1 is a block diagram showing an exemplary configuration of a digital camera in an embodiment with the application of the present disclosure.

FIG. 1 is a block diagram showing an exemplary configuration of a digital camera in an embodiment with the application of the present disclosure.

The digital camera is capable of capturing both still images and moving images.

In FIG. 1, the digital camera includes an optical system 1, an image sensor 2, a memory 3, a signal processing section 4, an output section 5, and a control section 6.

The optical system 1 includes components that are not shown, e.g., zoom lens, focus lens, and aperture. The optical system 1 directs light from the outside into the image sensor 2.

The image sensor 2 is a CMOS (Complementary Metal Oxide Semiconductor) image sensor, and captures images, for example. That is, the image sensor 2 receives light coming from the optical system 1, and performs photoelectric conversion on the light, thereby outputting image data corresponding to the light from the optical system 1.

The memory 3 temporarily stores the image data provided by the image sensor 2.

The signal processing section 4 performs signal processing using the image data stored in the memory 3, e.g., noise removal, and white balance adjustment. The resulting image data is supplied to the output section 5.

The output section 5 outputs the image data provided by the signal processing section 4.

That is, the output section 5 includes a display (not shown) being a liquid crystal display, for example, and displays an image corresponding to the image data from the signal processing section 4, i.e., displays a so-called through image.

The output section 5 also includes a driver (not shown) that drives a recording medium, e.g., semiconductor memory, magnetic disk, or optical disk, thereby recording the image data from the signal processing section 4 onto the recording medium.

The control section 6 controls the component blocks of the digital camera by following a user's operation, for example.

In the digital camera configured as above, the image sensor 2 receives light coming from the optical system 1, and outputs image data corresponding to the light.

The image data provided by the image sensor 2 is supplied to the memory 3 for storage therein. The image data stored in the memory 3 is subjected to signal processing by the signal processing section 4. The resulting image data is supplied to the output section 5 for output therefrom.

[Exemplary Configuration of Image Sensor 2]

Figure 2:
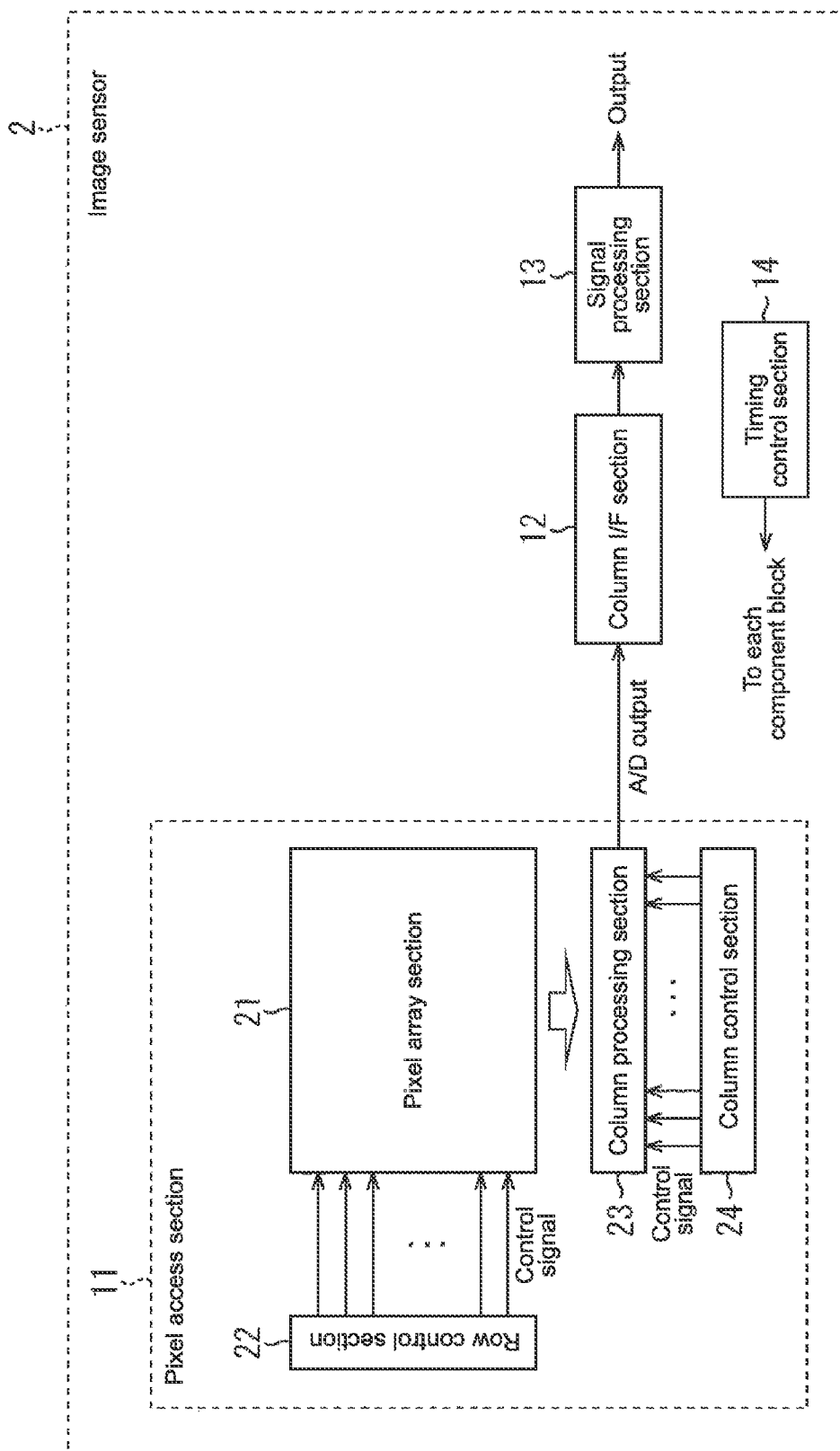
FIG. 2 is a block diagram showing an exemplary configuration of an image sensor.

FIG. 2 is a block diagram showing an exemplary configuration of the image sensor 2 of FIG. 1.

In FIG. 2, the image sensor 2 includes a pixel access section 11, a column I/F (Interface) section 12, a signal processing section 13, and a timing control section 14.

The pixel access section 11 includes pixels for photoelectric conversion. By access to the pixels, pixel values being image data are obtained and output.

That is, the pixel access section 11 includes a pixel array section 21, a row control section 22, a column processing section 23, and a column control section 24.

The pixel array section 21 includes a plurality of pixels that are regularly arranged two-dimensionally. The each pixel outputs an electric signal by photoelectric conversion.

The pixel array section 21 is under the control of the row control section 22, and reads the electric signals from the pixels therein on a row basis (on a horizontal-line basis). The electric signals are then supplied to the column processing section 23.

The row control section 22 performs access control for reading the electric signals from the pixels in the pixel array section 21.

The column processing section 23 performs AD (Analog-to-Digital) conversion or others on the electric signals (voltage) provided by the pixel array section 21. Such AD conversion or others are performed on a row basis, for example, and the resulting digital signals are supplied to the column I/F section 12 as pixel values.

The column control section 24 performs column control to supply (output) the pixel values obtained by the processing in the column processing section 23 to the column I/F section 12.

The column I/F section 12 temporarily stores the pixel values from the pixel access section 11 (the column processing section 23 therein), thereby serving as an interface for receiving the pixel values.

The signal processing section 13 performs predetermined signal processing on the pixel values, and outputs the processing results to the outside of the image sensor 2, e.g., to the memory 3 (FIG. 1). The pixel values are those read from the pixel access section 11 and stored in the column I/F section 12.

The timing control section 14 generates a timing signal for supply to any component blocks expecting the signal. The timing signal is for controlling the component blocks in the image sensor 2 when to operate.

Figure 3:
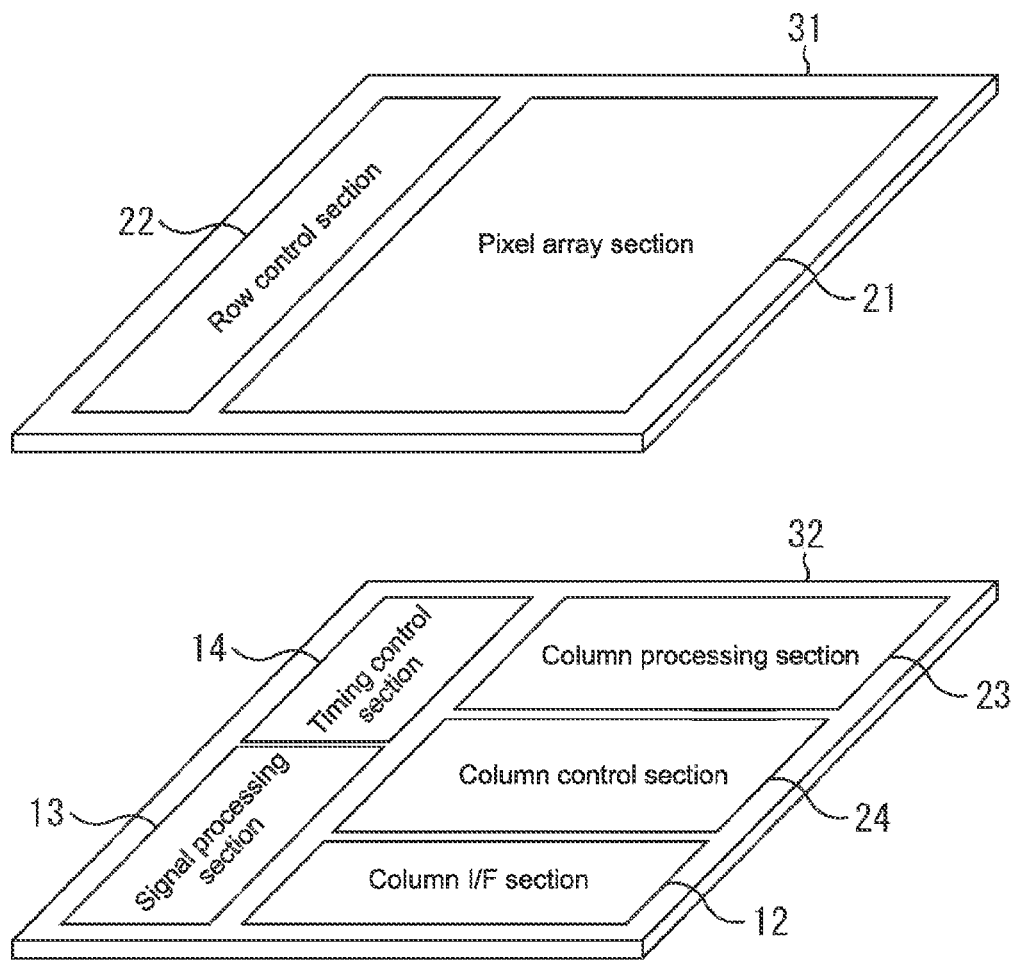
FIG. 3 is a perspective view of the image sensor, showing another exemplary configuration thereof.

FIG. 3 is a perspective view of the image sensor 2 of FIG. 1, showing another exemplary configuration thereof.

The image sensor 2 may be configured by one substrate (die), or by two substrates stacked one on the other.

FIG. 3 is specifically a perspective view of the image sensor 2, showing an exemplary schematic configuration of the two substrates stacked one on the other.

In FIG. 3, the upper substrate of the two substrates stacked one on the other, i.e., upper substrate 31, is formed with the pixel array section 21, and the row control section 22.

Also in FIG. 3, the lower substrate of the two substrates, i.e., lower substrate 32, is formed with the column I/F section 12, the signal processing section 13, the timing control section 14, the column processing section 23, and the column control section 24.

The image sensor 2 is configured as a one-chip stacked image sensor including the upper and lower substrates 31 and 32 stacked as above.

[Exemplary Configuration of Pixel Array Section 21 and Column Processing Section 23]

Figure 4:
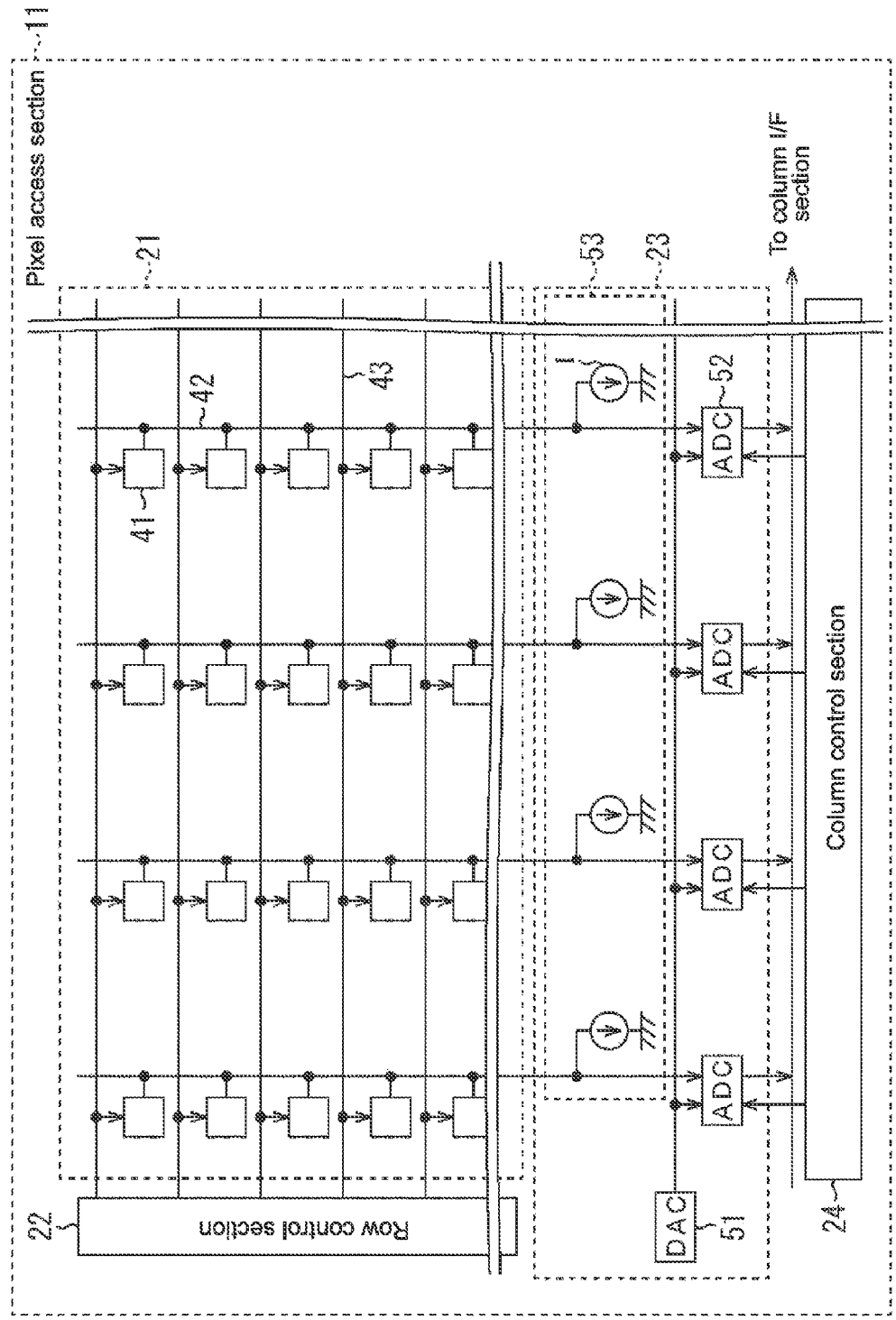
FIG. 4 is a block diagram showing an exemplary configuration of a pixel array section, and that of a column processing section.

FIG. 4 is a block diagram showing an exemplary configuration of the pixel array section 21 and that of the column processing section 23 of FIG. 2.

The pixel array section 21 includes two or more pixel units 41, which are regularly arranged two-dimensionally, e.g., arranged in a matrix.

The pixel units 41 are each a pixel that outputs an electric signal by photoelectric conversion, and the details thereof will be described later.

In the pixel array section 21, a VSL (Vertical Signal Line) 42 is provided to each column of the pixel units 41 in the column direction, i.e., in the vertical direction.

While being connected to each of the pixel units 41 on the corresponding column, the VSL 42 is connected also to the column processing section 23. The electric signals read from the pixel units 41 are supplied, i.e., transferred, to the column processing section via the VSL 42.

Also in the pixel array section 21, a row signal line 43 is provided to each row of the pixel units 41 in the row direction, i.e., in the lateral direction. The row signal line 43 is connected to the row control section 22, and to each of the pixel units 41 on the corresponding row.

The row control section 22 drives the row signal lines 43, that is, the row control section 22 supplies (passes) a control signal to the row signal lines 43, thereby controlling the pixel units 41 connected thereto. With such control by the row control section 22 over the pixel units 41, the electric signals to be pixel values are read from the pixel units 41 onto the VSLs 42 on a row basis.

The column processing section 23 includes a DAC (Digital Analog Converter) 51, X pieces of ADCs (AD converters) 52, and a current mirror 53. The ADCs 52 are provided as many as the number X of the columns of the pixel units 41 in the pixel array section 21, i.e., as many as the number of the VSLs 42.

The DAC 51 performs DA conversion to generate an analog reference signal for supply to the ADCs 52. The analog reference signal has a period for a level change from a predetermined initial value to a predetermined final value with a predetermined gradient like a ramp signal.

Among the X ADCs 52, the x-th (where x=1, 2, . . . , and X) ADC 52 is connected to the x-th VSL 42. The x-th ADC 52 is sequentially provided with the electric signals from the pixel units 41 on the x-th column via the x-th VSL 42.

As to the electric signal provided from the pixel unit 41 via the VSL 42, the ADC 52 keeps a comparison with the reference signal from the DAC 51. The ADC 52 counts the time until the reference signal reaches the same level with the electric signal, thereby performing AD conversion on the electric signal from the pixel units 41.

Thereafter, as being under the control of the column control section 24, the ADC 52 outputs the results of the AD conversion or others, i.e., pixel values being digital electric signals, to the column I/F section 12 (FIG. 2).

Herein, the ADCs 52 may be fewer in number than the X columns for the pixel units 41, e.g., X/2 ADCs. In this case, the x-th ADC 52 is connected with the pixel units 41 on the (2x−1)th column via the (2x−1)th VSL 42. The x-th ADC 52 is connected also with the pixel units 41 on the 2x-th column via the 2x–th VSL 42.

The x-th ADC 52 is in charge of AD conversion or others on the electric signals coming from the pixel units 41 on the odd-numbered (2x−1)th column, and the electric signals coming from the pixel units 41 on the even-numbered 2x-th column. Therefore, when the X/2 ADCs 52 are in use, each of the ADCs 52 performs the AD conversion by time sharing, i.e., first the pixel units 41 on the odd-numbered column, and then the pixel units 41 on the even-numbered column.

The current mirror 53 serves as a current source I, which is provided as many as the number X of the columns (the VSLs 42) for the pixel units 41 in the pixel array section 21, for example.

In the current source I, one end is grounded, and the other end is connected to the VSL 42, thereby feeding a constant current toward the GND. The current source I is a load for an SF (Source Follower) FET 64 (FIG. 5) being an amplifier transistor (amplifier Tr) in the pixel unit 41 that will be described later.

Herein, the current source I is a MOS FET, for example, and such a current source I being a MOS FET is referred to also as load MOS.

In the pixel access section 11 including the pixel array section 21 and the column processing section 23 configured as above, electric signals are read from the pixel units 41 starting from those on the first row.

As to the electric signals read from the pixel units 41, the voltage corresponding thereto is supplied to the column processing section 23 via the VSLs 42 for AD conversion, for example.

Thereafter, the pixel units 41 on the second row and downward are subjected to the processing similarly to the above on a row basis.

[Exemplary Configuration of Pixel Unit 41]

Figure 5:
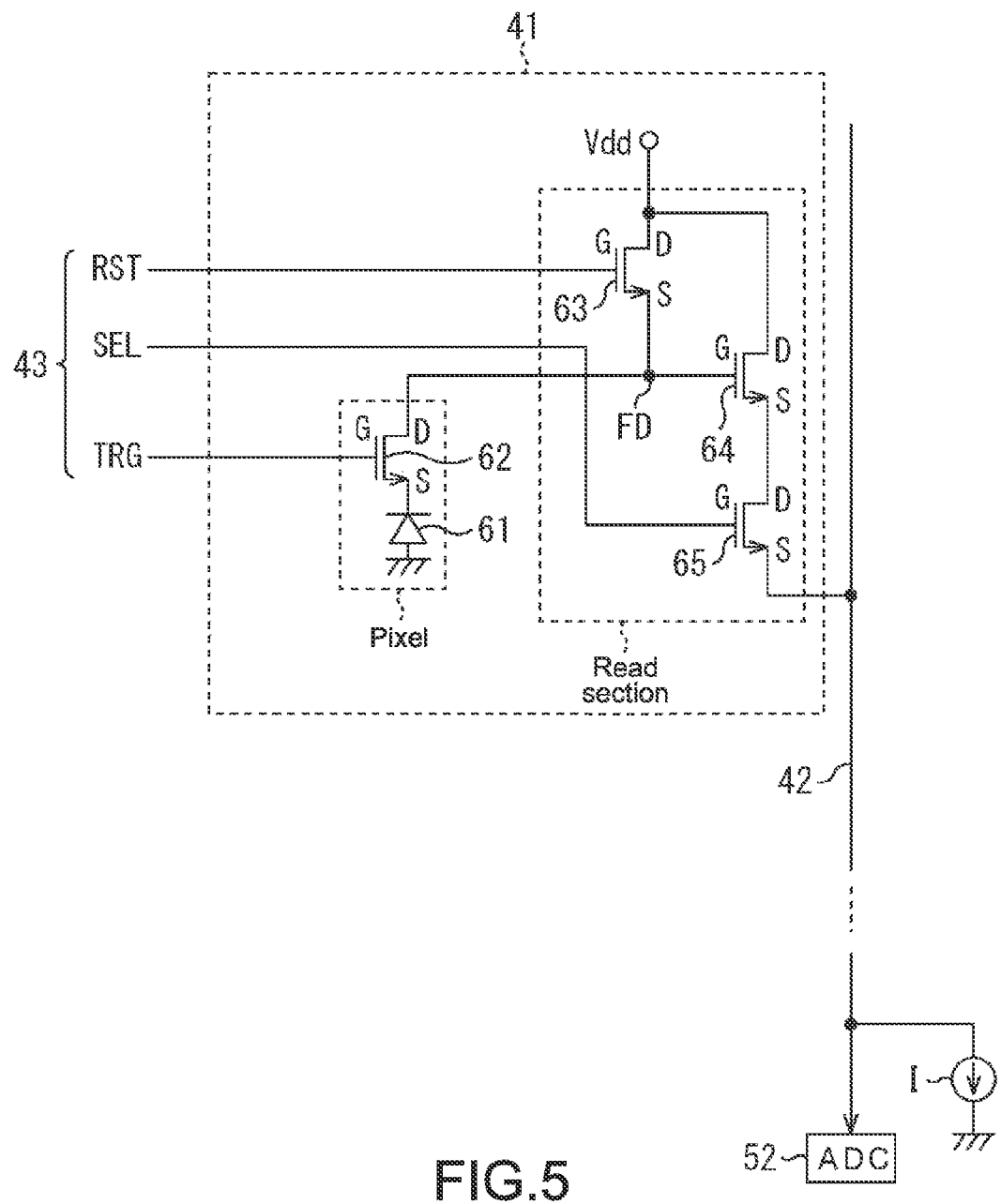
FIG. 5 is a circuit diagram showing an exemplary configuration of a pixel unit.

FIG. 5 is a circuit diagram showing an exemplary configuration of the pixel unit 41.

The pixel unit 41 of FIG. 5 includes a pixel, and nMOS FETs 63, 64, and 65, for example.

The pixel includes a PD (Photo Diode) 61 and an nMOS FET 62, and outputs an electric signal by photoelectric conversion.

The PD 61 is an exemplary photoelectric conversion element, and receives incoming light, and accumulates charge corresponding to the light, thereby performing photoelectric conversion.

In the PD 61, the anode is connected to the GND (is grounded), and the cathode is connected to the source of the FET 62.

The FET 62 is a transistor (Tr) for transferring the charge in the PD 61 therefrom to an FD (Floating Diffusion). Hereinafter, the FET 62 is referred to also as the transfer Tr 62.

In the transfer Tr 62, the source is connected to the cathode of the PD 61, and the drain is connected to the gate of the FET 64 via the FD.

Also in the transfer Tr 62, the gate is connected to the row signal line 43, and the gate is provided with a transfer pulse TRG over the row signal line 43.

The row control section 22 (FIG. 4) feeds a control signal to the row signal lines 43 for controlling the pixel units 41 via the row signal lines 43. This control signal includes not only the transfer pulse TRG but also a reset pulse RST and a selection pulse SEL that will be described later.

This means that the row signal lines 43 each include three control lines over which the respective pulses flow, i.e., transfer pulse TRG, reset pulse RST, and selection pulse SEL.

The FD is an area formed at a connection point between the source of the FET 63 and the gate of the FET 64. At such an FD, any charge supplied thereto is converted into a voltage like a capacitor does.

The FET 63 is a transistor for resetting the charge (voltage (potential)) accumulated at the FD, and hereinafter, is referred to also as the reset Tr 63.

In the reset Tr 63, the drain is connected to a power supply Vdd, and the source is connected to the FD.

Also in the reset Tr 63, the gate is connected to the row signal line 43, and the gate is provided with the reset pulse RST over the row signal line 43.

The FET 64 is a transistor for buffering the voltage at the FD, and hereinafter, is referred to also as the amplifier Tr 64.

In the amplifier Tr 64, the gate is connected to the FD, and the drain is connected to the power supply Vdd. Also in the amplifier Tr 64, the source is connected to the drain of the FET 65.

The FET 65 is for selecting whether to output the electric signal (voltage) or not to the VSL 42, and hereinafter, is referred to also as the selection Tr 65.

In the selection Tr 65, the source is connected to the VSL 42.

Also in the selection Tr 65, the gate is connected to the row signal line 43, and the gate is provided with the selection pulse SEL over the row signal line 43.

Herein, the selection Tr 65 is simply a switch for establishing an electrical connection between the pixel unit 41 and the VSL 42, and this is done one by one on a row basis. In the amplifier Tr 64, the source is connected to the current source I being an SF load via the selection Tr 65 being simply a switch and the VSL 42. Therefore, the amplifier Tr 64 is the SF amplifier Tr.

Accordingly, in the pixel unit 41, the voltage corresponding to the charge accumulated at the FD is supplied to the ADC 52 via the SF amplifier Tr 64.

Herein, the amplifier Tr 64 and the selection Tr 65 may be changed in position.

The pixel unit 41 may be configured without including the selection Tr 65.

In the pixel unit 41 configured as above, the PD 61 receives incoming light, and performs photoelectric conversion thereon, thereby starting accumulation of charge as appropriate to the amount of the received light. Herein, for simplicity, the selection pulse SEL is being in the H (High) level, and the selection Tr 65 is being turned ON.

With a lapse of a predetermined length of time (exposure time) after the accumulation of charge is started in the PD 61, the row control section 22 (FIG. 4) temporarily changes the level of the transfer pulse TRG (from L (Low)) to H.

In response to the transfer pulse TRG being temporarily changed in level to H, the transfer Tr 62 is temporarily turned ON.

When the transfer Tr 62 is turned ON, the charge accumulated in the PD 61 is transferred to the FD via the transfer Tr 62 for accumulation thereat.

Before temporarily changing the transfer pulse TRG in level to H, the row control section 22 temporarily changes the level of the reset pulse RST to H, thereby temporarily turning ON the reset Tr 63.

In response to the reset Tr 63 being turned ON, the FD is connected to the power supply Vdd via the reset Tr 63, and the charge at the FD is discharged to the power supply Vdd via the reset Tr 63, and then is reset.

Herein, the charge at the FD being reset by the FD being connected to the power supply Vdd as described above is referred to as resetting of the pixel unit 41 (or of the pixel).

After the resetting of charge at the FD, the row control section 22 temporarily changes the level of the transfer pulse TRG to H as described above so that the transfer Tr 62 is temporarily turned ON.

With the transfer Tr 62 being turned ON, the charge accumulated in the PD 61 is transferred to the FD after the resetting via the transfer Tr 62 for accumulation thereat.

Thereafter, the voltage (potential) corresponding to the charge accumulated at the FD is output as an electric signal onto the VSL 42 via the amplifier Tr 64 and the selection Tr 65. This varies the voltage of the VSL 42, i.e., VSL voltage.

In the ADC 52 (FIG. 4) connected to the VSL 42, the VSL voltage immediately after the resetting of the pixel unit 41, i.e., reset level, is subjected to AD conversion.

Also in the ADC 52, the VSL voltage after the transfer Tr 62 is temporarily turned ON, i.e., signal level, is subjected to AD conversion. Herein, the VSL voltage is one corresponding to the charge transferred to the FD from the PD 61, and the signal level includes both the reset level and the level being a pixel value.

The ADC 52 then performs CDS (Correlated Double Sampling), and the resulting electric signal is output to the column I/F section 12 (FIG. 2) as a pixel value. The CDS is performed for finding, as a pixel value, a difference of AD conversion results between the reset level and the signal level.

The pixel value is thus read from the pixel in the pixel unit 41 as described above.

In FIG. 5, a read section for reading an electric signal from the pixel is configured by the reset Tr 63, the amplifier Tr 64, the selection Tr 65, and the FD.

The pixel unit 41 of FIG. 5 uses the read section to read an electric signal from only one pixel, i.e., the pixel unit 41 is in the unit pixel configuration. Alternatively, the pixel unit 41 may include a plurality of pixels, and may use the read section to read an electric signal from each of a plurality of pixels, i.e., the pixel unit 41 may be in the shared pixel configuration.

In the pixel unit 41 in the shared pixel configuration with a plurality of pixels, the transfer Tr 62 may be turned ON sequentially for each of the pixels so that an electric signal is read sequentially from the pixels.

[Exemplary Configuration of Current Mirror 53]

Figure 6:
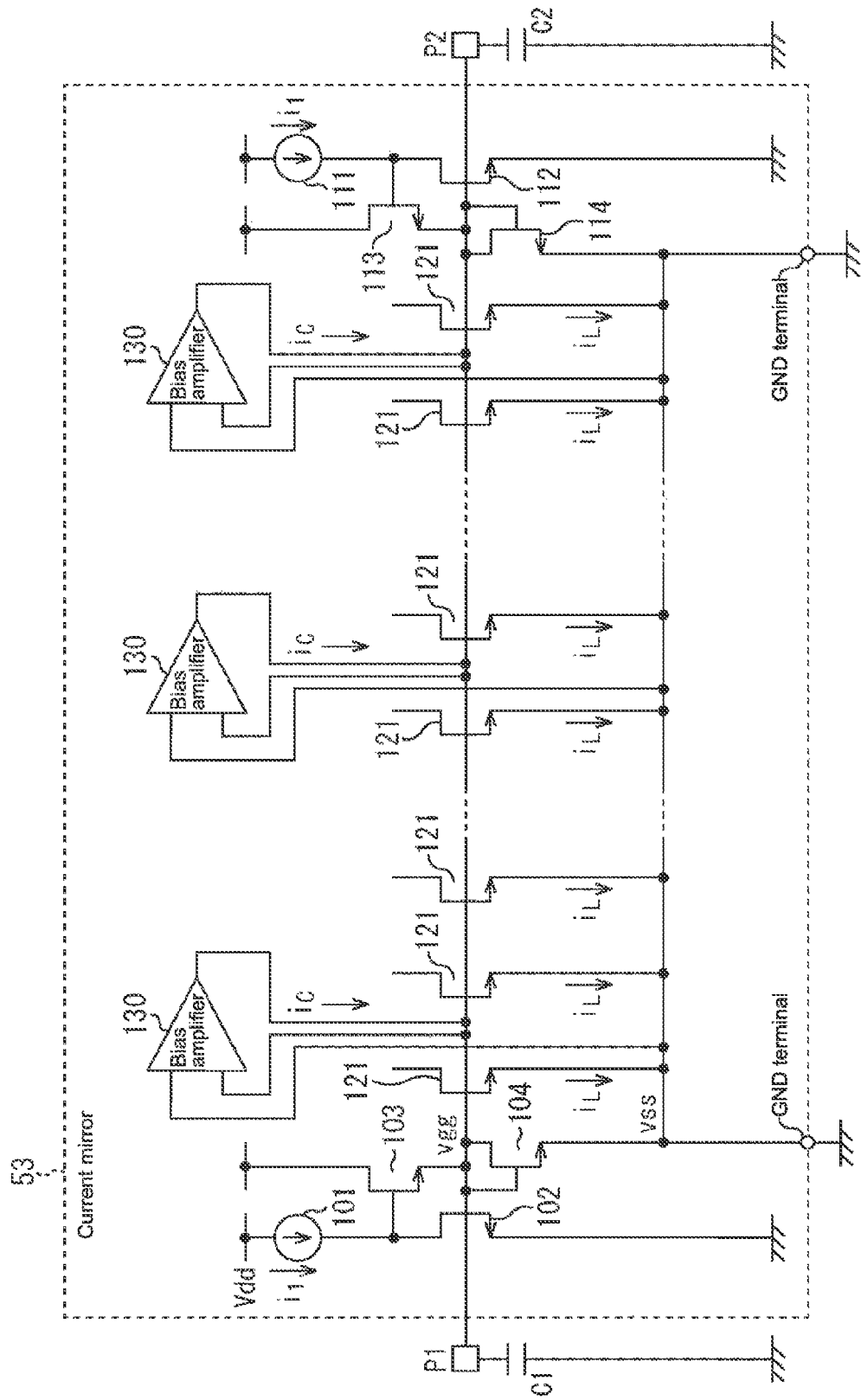
FIG. 6 is a circuit diagram showing an exemplary configuration of a current mirror.

FIG. 6 is a circuit diagram showing an exemplary configuration of the current mirror 53 of FIG. 4.

In FIG. 6, the current mirror 53 includes a current source 101, FETs 102, 103, and 104, a current source 111, FETs 112, 113, and 114, X pieces of FETs 121, and Y pieces of bias amplifiers 130.

The current source 101 and the FETs 102 to 104 are the driver components in the current mirror 53, and generate a reference potential of the current mirror 53.

That is, in the current source 101, one of two terminals is connected to the power supply Vdd, and the remaining terminal is connected to the drain of the FET 102, thereby providing a predetermined level of current $i_f$. Hereinafter, the current $i_f$ coming from the current source 101 is referred to also as reference current $i_f$.

The FET 102 is an nMOS FET, and the source thereof is grounded, and the gate thereof is connected to a gate line vgg.

The gate line vgg is a conductor line with a uniform width, for example, and ends thereof are respectively connected to external pads P1 and P2 of an embodiment for the current mirror 53, where the embodiment includes semiconductor, process, package, or printed circuit.

The FET 103 is an nMOS FET, and the drain thereof is connected to the power supply Vdd, the gate thereof is connected to the drain of the FET 102, and the source thereof is connected to the gate line vgg.

The FET 104 is an nMOS FET, and the source thereof is grounded via (the pad as) the GND terminal(s). The FET 104 is also diode-connected, i.e., the gate and the drain are connected, and the gate and the drain are both connected to the gate line vgg.

The FET 104 is a load of the FET 103, and serves as a current source. Therefore, the FET 103 is the SF FET, and the driver components in the current mirror 53 use the SF FET 103 to drive the current mirror 53 (the load components therein), i.e., configure an SF circuit.

Similarly to the current source 101 and the FETs 102 to 104, the current source 111 and the FETs 112 to 114 are the driver components in the current mirror 53, and configure an SF circuit for generating a reference potential.

Herein, the components above, i.e., the current source 111 and the FETs 112 to 114, are configured similarly to the current source 101 and the FETs 102 to 104, and thus are not described twice below as appropriate.

The X FETs 121 are each a load nMOS FET in the current mirror 53, and each of the X FETs 121 configures the current source I of FIG. 4. These X FETs 121 are arranged in line (in the horizontal direction in FIG. 6) while being effectively uniformly distributed.

In each of the load FETs 121, the gate is connected to the gate line vgg, and the source is connected to a GND line vss. Although not shown, the drain of each of the FETs 121 is connected to the VSL 42 (FIG. 4).

The GND line vss is a conductor line with a uniform width, for example, and is provided to be in parallel with the gate line vgg. The GND line vss is connected at the ends with the GND terminals of the implementation for the current mirror 53, and thus has the GND potential of the implementation.

The load FETs 121 each receive, at the gate over the gate line vgg, the reference potential generated in the driver components, thereby feeding a mirror current $i_L$ (to the source). The mirror current $i_L$ is proportional to the reference current $i_l$ flowing from the driver current source 101 (111) to the FET 102 (112).

Note than the current mirror 53 has a mirror ratio, which is a ratio between the reference current $i_l$ flowing in the driver FET 102, and the total amount of the mirror current $i_L$ flowing in the X load FETs 121, i.e., ideally, $i_L \times X$. In the current mirror 53, a desirable mirror ratio is realized by adjusting the FET 102 (and 112) and the FET 121, e.g., channel width W, multiplicity factor, or the number of fingers.

FIG. 6 schematically shows the X load FETs 121 being uniformly spread physically across the current mirror 53. In the image sensor 2, the X load FETs 121 each being a current source I may be increased in order to several thousands if many. If this is the case, the resulting current mirror 53 may be extremely loaded.

As to the bias amplifier 130, the number thereof is one or more but is fewer than the X load FETs 121, e.g., Y bias amplifiers 130 where Y=7. The Y bias amplifiers 130 are provided at predetermined Y locations above the gate line vgg and the GND line vss.

The bias amplifiers 130 monitor, from where they are, the voltage between the gate line vgg and the GND line vss, i.e., the gate-source voltage $V_{GS}$ of the FETs 121, and feed a current $i_C$ to the gate line vgg. The bias amplifiers 130 thus bias the gate line vgg so as to make constant the gate-source voltage $V_{GS}$ for the X FETs 121. Herein, the expression of "to make constant the gate-source voltage" means to obtain the voltage that may be regarded as being constant, and the obtained voltage may be almost (substantially) constant.

Hereinafter, the locations where the bias amplifiers 130 are provided are referred to also as correction points, and the current $i_C$ fed by the bias amplifiers 130 (to the gate line vgg) is referred to also as correction current $i_C$.

In the large-load current mirror 53 configured as above, the gate voltage of the FET 102 to which the reference current $i_l$ is provided by the current source 101 is applied to the gate of each of the X FETs 121. The gate voltage is applied as a reference potential via the gate line vgg. With such voltage application, the X FETs 121 are each provided with the mirror current $i_L$ proportional to the reference current $i_l$.

In the large-load current mirror 53 of FIG. 6, i.e., in the current mirror 53 including a large number of FETs (X FETs) 121 each being a load FET (load), the mirror current $i_L$ flowing in these load FETs 121 is fed to the GND line vss.

As a result, this causes a phenomenon of increasing the GND potential on the GND line vss as the GND line is spatially away from the GND terminal(s).

With the spatial distribution of the GND potential as above, the farther the FET 121 is away from the GND terminal(s), the lower the gate-source voltage $V_{GS}$ thereof becomes so that the mirror current therein is also reduced.

In consideration thereof, in the current mirror 53, the bias amplifiers 130 feed the correction current $i_C$ to the gate line vgg so that the gate potential on the gate line vgg (potential at the gate of each of the X FETs 121) is corrected to spatially distribute similarly to the GND potential on the GND line vss. Such a correction accordingly reduces any influence of the GND-potential spatial distribution, i.e., any influence of the fact that the farther the FET 121 is away from the GND terminal(s), the lower the gate-source voltage $V_{GS}$ thereof becomes so that the mirror current therein is reduced.

That is, the current mirror 53 does not reduce the GND-potential spatial distribution being a result of the mirror current $i_L$ flowing from the X FETs 121 to the GND line vss, but adjusts the gate-potential spatial distribution on the gate line identical to the GND-potential spatial distribution, so reducing the effects of the GND-potential spatial distribution.

Herein, such an above-mentioned method is referred to also as gate potential correction, i.e., method to reduce any influence of the GND-potential spatial distribution on the GND line vss by correcting the gate-potential spatial distribution on the gate line vgg similarly thereto.

Hereinafter, the GND potential on the GND line vss is referred to also as vss potential, and the gate potential on the gate line vgg is referred to also as vgg potential.

As described above, for simplicity, the X load FETs 121 are assumed to be effectively uniformly distributed, and the gate line vgg and the GND line vss are assumed to be each with a uniform thickness. However, even if the X FETs 121 are not uniformly distributed, and even if the gate line vgg and the GND line vss are each not with a uniform thickness, the gate potential correction is applicable, as appropriate to the implementation, by position adjustment of the correction points where the bias amplifiers 130 are provided, for example.

Figure 7:
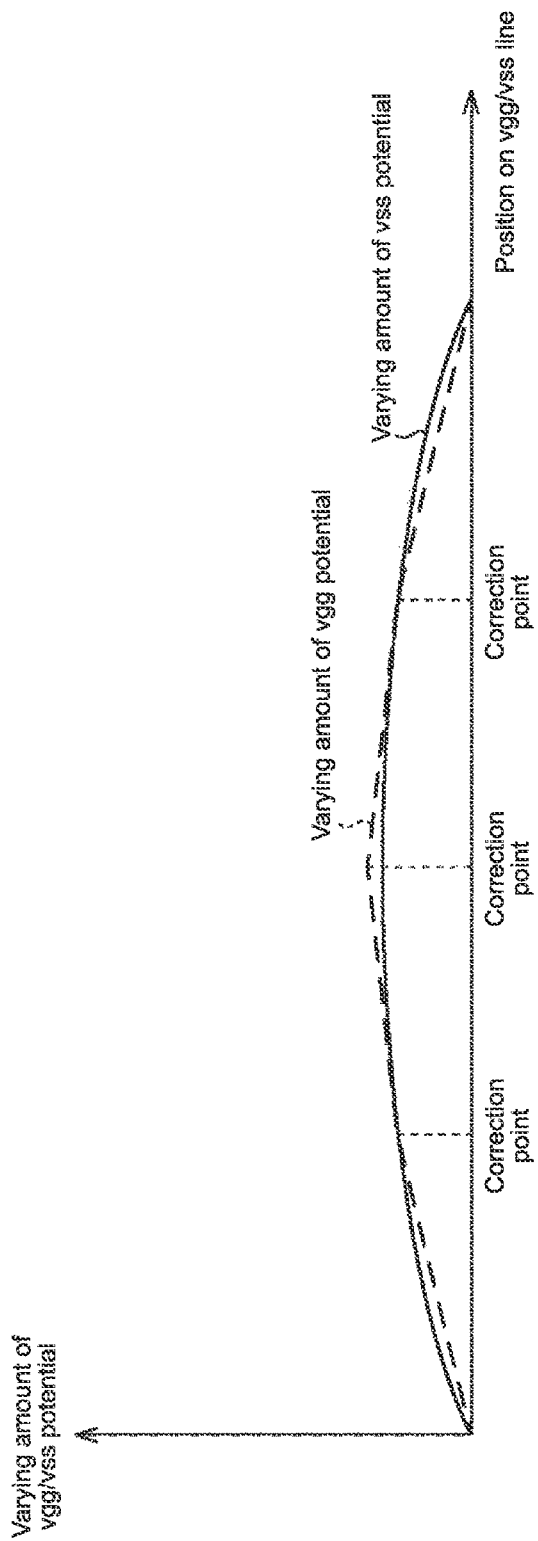
FIG. 7 is a diagram illustrating an exemplary spatial distribution of vgg potential, and that of vss potential.

FIG. 7 is a diagram illustrating an exemplary vgg-potential spatial distribution, and an exemplary vss-potential spatial distribution.

In FIG. 7, the lateral axis indicates the position of the correction point on the gate line vgg or on the GND line vss, and the vertical axis indicates variations in the vgg potential depending on where the correction point is positioned on the gate line vgg, or variations in the vss potential depending on where the correction point is positioned on the GND line vss.

As described above, assuming that the GND line vss has the GND potential at its ends in the implementation, when the mirror current $i_L$ is uniformly fed to the GND line vss, the vss-potential spatial distribution looks like a parabola as shown in FIG. 7 with a solid line, i.e., has a peak at the center of the GND line vss.

When the vss-potential spatial distribution looks like such a parabola, if the vgg potential is constant, the closer the FET 121 is to the center of the gate line vgg, the lower the gate-source voltage $V_{GS}$ thereof becomes so that the mirror current $i_L$ therein is reduced.

With the gate potential correction, such a reduction of the mirror current $i_L$ is prevented by the bias amplifiers 130 feeding the correction current $i_C$ to the gate line vgg so as to correct the vgg-potential spatial distribution similarly to the vss-potential spatial distribution.

The current mirror generally does not expect too much for the mirror current to be absolutely accurate. Therefore, with the gate potential correction, the vgg-potential spatial distribution is not corrected to be exactly identical (in shape) with the vss-potential spatial distribution. That is, the vgg-potential spatial distribution may be corrected by piecewise linear approximation to the vss-potential spatial distribution.

For correcting the vgg-potential spatial distribution by piecewise linear approximation to the vss-potential spatial distribution, the bias amplifiers 130 may be provided to three correction points with which the gate line vgg is equally divided into four, for example. Only with this, as indicated by a dotted line in FIG. 7, the vgg-potential spatial distribution as a result of the piecewise linear approximation to the vss-potential spatial distribution may be relatively accurate.

When the correction points are fewer in number, the vgg-potential spatial distribution as a result of the piecewise linear approximation to the vss-potential spatial distribution may have a large approximation error with respect thereto. This approximation error affects the mirror current $i_L$.

However, the mirror current $i_L$ may be affected also by variations in the FETs 121. Even if the vgg-potential spatial distribution is with only a margin of approximation error with a fewer number of correction points, the mirror current $i_L$ may be affected more by the variations in the FETs 121 than by the approximation error in the vgg-potential spatial distribution.

Therefore, the correction points may be reduced in number as long as an approximation error in the vgg-potential spatial distribution does not affect the mirror current $i_L$ more than the variations in the FETs 121.

When the X load FETs 121 are increased in order to several thousands, for example, the bias amplifiers 130 that are much fewer in number than the X FETs 121, e.g., about 1/100 of X, may be positioned as appropriate, i.e., positioned at correction points. This may obtain the vgg-potential spatial distribution that is identical enough with the vss-potential spatial distribution by approximation thereto.

[First Exemplary Configuration of Bias Amplifier 130]

Figure 8:
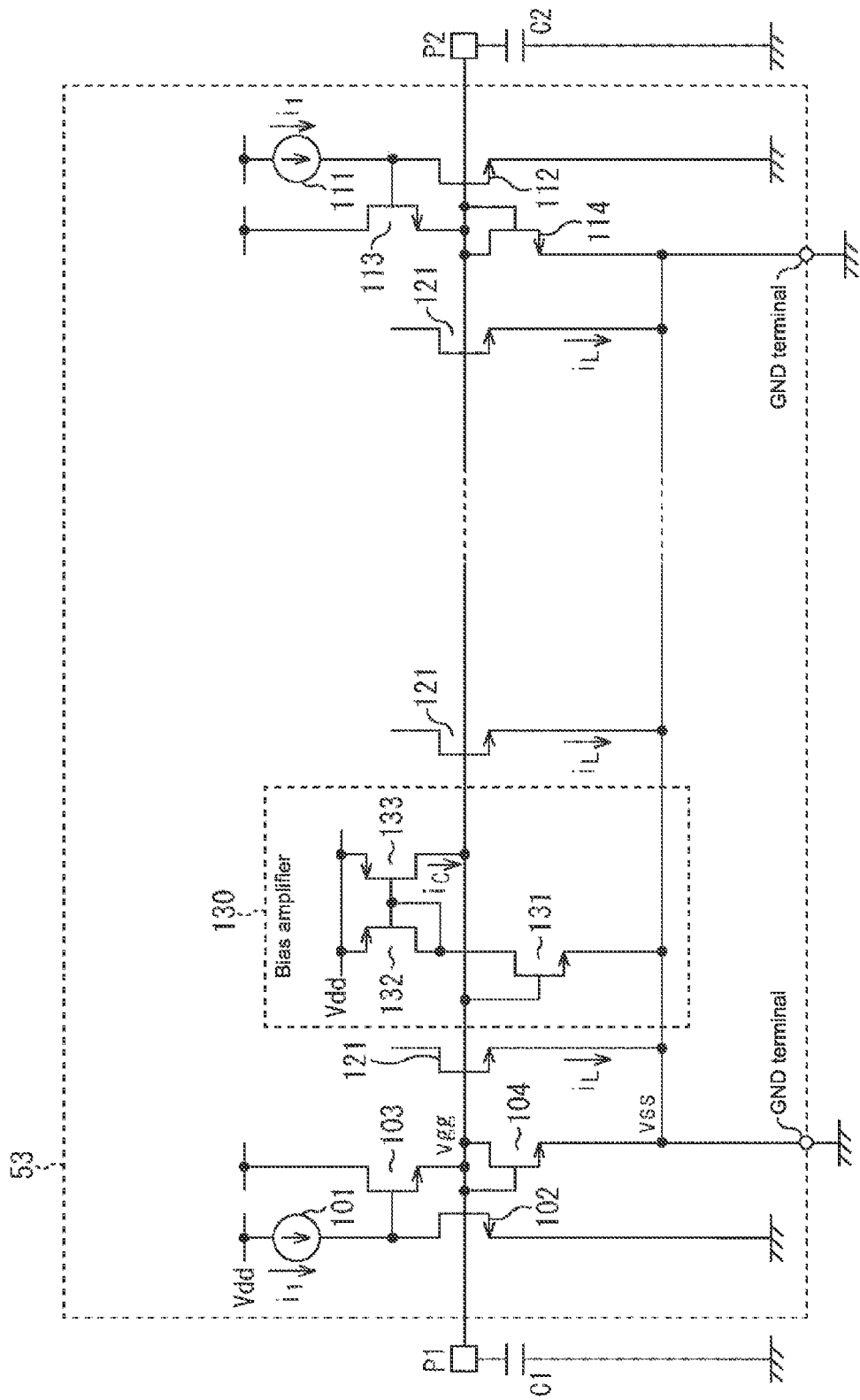
FIG. 8 is a circuit diagram showing a first exemplary configuration of a bias amplifier.

FIG. 8 is a circuit diagram showing a first exemplary configuration of the bias amplifier 130 of FIG. 6.

In FIG. 8, the bias amplifier 130 includes FETs 131, 132, and 133.

The FET 131 is an nMOS FET, and the gate thereof is connected to the gate line vgg, the drain thereof is connected to the drain of the FET 132, and the source thereof is connected to the GND line vss.

The FET 131 configures a current mirror in which the FET 131 is the load FET, and the FET 102 is the driver FET. The FET 131 feeds (generates) a current corresponding to the mirror ratio of the current mirror when the reference current $i_l$ comes.

The FETs 132 and 133 are each a pMOS FET, and configure a current mirror. That is, as to the FETs 132 and 133, their gates are connected together, and their sources are both connected to the power supply Vdd. The connection point between the gates of the FETs 132 and 133 is connected to the drain of the FET 132.

The drain of the FET 133 is connected to the gate line vgg. The current flowing to the drain of the FET 133 is fed to the GND vss as the correction current $i_C$.

Herein, strictly speaking, the correction point is a connection point between the drain of the FET 133 and the gate line vgg, i.e., a point to which the correction current $i_C$ is fed from the FET 133 to the gate line vgg.

In the bias amplifier 130 configured as above, the FET 131 is provided with a current corresponding to the mirror current $i_L$. This mirror current $i_L$ is one flowing in the load FET 121 located in the proximity of the correction point where the bias amplifier 130 is positioned. Hereinafter, such a load FET 121 is referred to also as proximal FET.

That is, as to the FET 131 and the proximal FET 121, their gates are both connected to the gate line vgg, and their sources are both connected to the GND line vss. Therefore, when the FET 131 and the proximal FET 121 are in the same size, the FET 131 is provided with a current (source current) that is (almost) the same as the mirror current $i_L$ flowing in the proximal FET 121.

The current flowing to the FET 131 is then fed to the FET 132 being a part of the current mirror. The current is then fed back to the FET 133.

That is, the current flowing to the FET 131 is in the direction from the gate line vgg to the GND, and when reaching the current mirror configured by the FETs 132 and 133, the current is reversed in direction for a supply from the power supply Vdd to the gate line vgg. In this sense, the current mirror configured by the FETs 132 and 133 is the direction-reversing current mirror that reverses the direction of the current flowing in the FET 131.

The current flowing to the FET 133 after being reversed in direction from the FET 131 is fed to the gate line vgg as the correction current $i_C$.

The correction current $i_C$ may be adjusted by the mirror ratio of the current mirror configured by the FETs 102 and 131, or the mirror ratio of the direction-reversing current mirror configured by the FETs 132 and 133. With such adjustments as described above, the vgg-potential spatial distribution may be corrected by approximation to the vss-potential spatial distribution, e.g., adjustment of mirror ratios, position adjustment of the correction points where the bias amplifiers 130 are placed, and adjustment of the number of the bias amplifiers 130.

The GND line vss (GND potential thereof) is used as the reference to the operation of the current mirror 53, and is desirably wide. On the other hand, the gate line vgg may be much narrower than the GND line vss because the impedance reduction is not so expected. Herein, the width ratio between the GND line vss and the gate line vgg, to be more precise, the resistance ratio (value of ratio) between the gate line vgg and the GND line vss per unit length is expressed as w:1(w) (the ratio w). In this case, generally, the resistance ratio w often becomes about several tens to several hundreds.

As described above, the resistance ratio w is about several tens to several hundreds, and the gate line vgg has a resistance much higher than that of the GND line vss. Therefore, the difference of the resistance reduces the amount of the correction current $i_C$ for use to correct (compensate) the gate potential (the spatial distribution thereof) of the gate line vgg compared with the amount of the mirror current $i_L$.

The correction current $i_C$ will approximately satisfy Equation 1 with the mirror current $i_L$.

$$Y i_C w = X i_L \qquad 1$$

As described above, in Equation 1, X denotes the number of the load FETs 121, and Y denotes the number of the correction points (the number of the bias amplifiers 130).

Equation 1 is understood as being a relational expression to equate the current density between the gate line vgg and the GND line vss on the assumption that the X load FETs 121 and the Y correction points are both sufficiently large in number, and the X FETs 121 are uniformly distributed.

That is, Equation 1 represents a condition for equating the ratio $Yi_C:Xi_L$ with the width ratio 1:w between the gate line vgg and the GND line vss, where $Yi_C$ denotes the total sum of the correction current $i_C$, and $Xi_L$ denotes the total sum of the mirror current $i_L$.

When the correction points are fewer in number, Equation 1 becomes less exact in terms of minimizing an approximation error in the vgg-potential spatial distribution after correction by approximation to the vss-potential spatial distribution, and the approximation error is increased.

For reducing the approximation error in the vgg-potential spatial distribution after correction by approximation, finely adjusting the correction current $i_C$ for every correction point is a possibility. However, such a fine adjustment is generally expected only when the Y correction points are extremely few in number, e.g., Y<4. Note that finely adjusting the correction current $i_C$ for every correction point may be done irrespective of the number Y of correction points.

When the gate line vgg has a width being 1/100 of the GND line vss, for example, satisfied is w=100. This value of w=100 is actually often used considering the minimum possible width for the line.

The larger the value of w, the smaller the total sum $Yi_C$ of the correction current $i_C$ becomes so that the power consumption may be reduced.

Assuming that the Y correction points is 1/100 of the X load FETs 121, i.e., 100Y=X, Equation 1 may be $i_C=i_L$. This means that the correction current $i_C$ may be equated with the mirror current $i_L$.

This allows the FETs 131 and 121 to be in the same size, and this is convenient in view of designing, i.e., the FET 131 for providing a current corresponding to the mirror current $i_L$ (generating a current to be (the basis of) the correction current $i_C$), and the FET 121 for providing (generating) the mirror current $i_L$.

Even if the correction current $i_C$ is not equated with the mirror current $i_L$, by giving appropriate consideration to the width ratio (value of ratio) between the GND line vss and the gate line vgg, i.e., w:1(w), and to the number of the correction points Y, i.e., the number of lines for approximation to the GND-potential vss, the size ratio between the components of the bias amplifier 130 (the FETs 131 to 133) and the load FET 121 may not be too large nor small, and may be close to an integer.

As an example, assuming that the number X of the load FETs 121 is over 1000, the correction current $i_C$ in use is equated with the mirror current $i_L$, and w=100 is satisfied, Equation 1 shows that the number Y of the correction points, i.e., the number of lines for approximation to the GND-potential vss, is Y>10. Therefore, with the gate potential correction, the approximation to the GND-potential (vss-potential) spatial distribution may be done with the sufficient number of lines, i.e., Y>10.

In the current mirror 53, the load current $i_L$ flows to the GND line vss, and the current flowing in the GND line vss is absorbed by (the pad as) the GND terminals connected to the GND line vss, i.e., is evacuated by the GND terminals.

Also in the current mirror 53, for every GND terminal(s) of absorbing the current flowing to the GND line vss (hereinafter, referred to also as vss current), the diode-connected FET 104 (and the FET 114) is provided as a draw-out circuit. This draw-out circuit is for drawing out (absorbing) the current flowing to the gate line vgg (hereinafter, referred to also as vgg current).

That is, as described by referring to FIG. 6, the FET 104 (114) is a current source for the SF FET 103 (113), but serves also as a draw-out circuit to draw out the vgg current.

With the configuration as above, i.e., the FETs 104 and 114 are provided each as a draw-out circuit to draw out the vgg current flowing to the gate line vgg at the positions where the GND terminals are provided to absorb the vss current flowing to the GND line vss, the vgg-potential spatial distribution may be so corrected as to be identical (in shape) with the vss potential spatial distribution.

In this embodiment, the GND line vss is provided at the ends with the GND terminals. Therefore, at the two positions being the ends of the GND line vss, the FETs 104 and 114 are provided each as a draw-out circuit.

The FETs 104 and 114 being the draw-out circuits are each in charge of drawing out a half of the vgg current.

When the driver component in the current mirror 53 is not an SF circuit but a diode circuit, i.e., when the FETs 103 and 104 (113 and 114) are not provided, and when the FET 102 (112) is in diode-connection (the gate and the drain are connected), for example, the FET 102 is provided not only with the reference current $i_I$ from the current source 101 but also with (a half of) the vgg current. As a result, the mirror current $i_L$ becomes less accurate.

For preventing the mirror current $i_L$ from becoming less accurate as above when the driver component in the current mirror 53 is a diode circuit, there is expected to provide a large amount of reference current $i_I$ with which the vgg current flowing to the FET 102 is negligible. Moreover, for feeding such a large amount of reference current $i_I$ to the FET 102, the FET 102 (112) for use is expected to be large in size.

In consideration thereof, the driver component in the current mirror 53 is not a diode circuit but an SF circuit.

With the SF current mirror 53, the FET 104 (114) being a current source for the SF FET 103 (113) absorbs both an SF current and (a half of) the vgg current. The SF current is one flowing in the SF FET 103 to make it operate.

In the SF current mirror 53, even if the current coming from the FET 104 being an SF current source is somewhat different in amount, this only causes a change of the SF current flowing in the SF FET 103, i.e., causes (almost) no change of the vgg potential (at the position where the FET 103 is connected to the gate line vgg).

Moreover, even if the vgg current flows to the FET 104 being an SF current source, this only reduces the SF current flowing to the SF FET 103 by the amount of the vgg current, i.e., causes no change of the vgg potential.

As described above, even if the vgg current flows to the FET 104 being an SF current source, the vgg potential shows no change. The SF current mirror is thus able to make sure that mirror accuracy remains high. The mirror accuracy is the degree of matching between the ratios, that is, the ratio between the actual reference current $i_I$ and (the total sum of) the mirror current $i_L$, and the mirror ratio expected to the current mirror 53, i.e., mirror ratio being a design value.

For effectively utilizing such a mechanism that the vgg potential shows no change even if the vgg current flows to the FET 104 (114) being an SF current source, the current mirror 53 includes the driver SF circuit each at the GND terminals where the FETs 104 and 114 are provided each as a draw-out circuit serving also as an SF current source.

In the current mirror 53 of this embodiment, the GND terminals are provided only to the ends of the GND line vss. This is not restrictive, and when the load FETs 121 are large in number in the current mirror 53, and when the vss current (total sum of the mirror current $i_L$) flowing to the GND line vss is large in amount, the current mirror 53 may include three or more GND terminals.

That is, the current mirror 53 may include three GND terminals in total, e.g., at the ends of the GND line vss, and at the center thereof.

When the current mirror 53 includes three GND terminals as above, for example, the driver SF circuit may be provided to the three locations, i.e., at the ends of the GND line vss (and at those of the gate line vgg), and at the center thereof.

However, there may be a difficulty in providing the driver SF circuit at the center of the GND line vss. Therefore, as an alternative to the driver SF circuit, a diode or others may be provided at the center of the GND line vss to serve as a draw-out circuit to draw out about ⅓ of the vgg current flowing to the gate line vgg.

When the vgg current is three times larger in amount than the mirror current $i_L$ flowing in the FET 121, for example, the draw-out circuit to draw out ⅓ of the vgg current may be a diode-connected FET or others in the same size as the FET 121.

In FIG. 8 (FIG. 6), the driver SF circuit is provided at the ends of the GND line vss (and the gate line vgg). Alternatively, the current mirror 53 may include the driver SF circuit only at one end of the GND line vss, and at the remaining end, a draw-out circuit may be provided to draw out about ½ of the vgg current flowing to the gate line vgg.

When the GND terminal(s) is (are) allowed to be provided only at one end of the GND line vss or only at other location, the current mirror 53 may include the driver SF circuit serving also as a draw-out circuit at the same location where the GND terminal(s) is (are) provided.

Further, when the GND terminal(s) is (are) away from the GND line vss, and when floating of the GND terminal(s) is (are) not negligible, the vgg current to be drawn out from the gate line vgg is increased or decreased in amount, for example. In this case, the gate-source voltage (voltage between the gate line vgg and the GND line vss) of the X FETs 121 may be adjusted to be constant.

Alternatively, the current mirror 53 may be additionally provided with any appropriate circuit to have characteristics of responding to a wide variety of variations. Such modifications may be made as appropriate depending on the number or locations of the GND terminals.

Herein, as to the FET 104 (114) serving not only as an SF current source but also as a draw-out circuit to draw out the vgg current, it is important to make sure that the current remains to flow therein not to stop the SF current flowing to the SF FET 103 (113).

In the large-load current mirror 53, there may be a case that a leak current is not negligible when it reaches the FET 104 (114) from the gate of the load FET 121 being a load. Therefore, it is important to design the current mirror considering variations in such a leak current, i.e., the FET 104 (114) being a draw-out circuit draws out the current so as to leave enough SF current for the SF FET 103 (113).

In FIG. 8 (FIG. 6), the pads P1 and P2 at the ends of the gate line vgg are respectively connected with external large-capacity capacitors C1 and C2. These capacitors C1 and C2 are for noise reduction in the current mirror 53.

According to the inventor of the present application, in the current mirror in which a driver component is a diode circuit, the capacitors C1 and C2 are confirmed to be extremely effective for noise reduction.

Compared with the current mirror 53 with the driver component being a diode circuit, the current mirror 53 with the driver component being an SF circuit has a considerably different noise spectrum. However, the capacitors C1 and C2 are probably effective for noise reduction also in the current mirror 53 with the driver component being an SF circuit.

Figure 9:
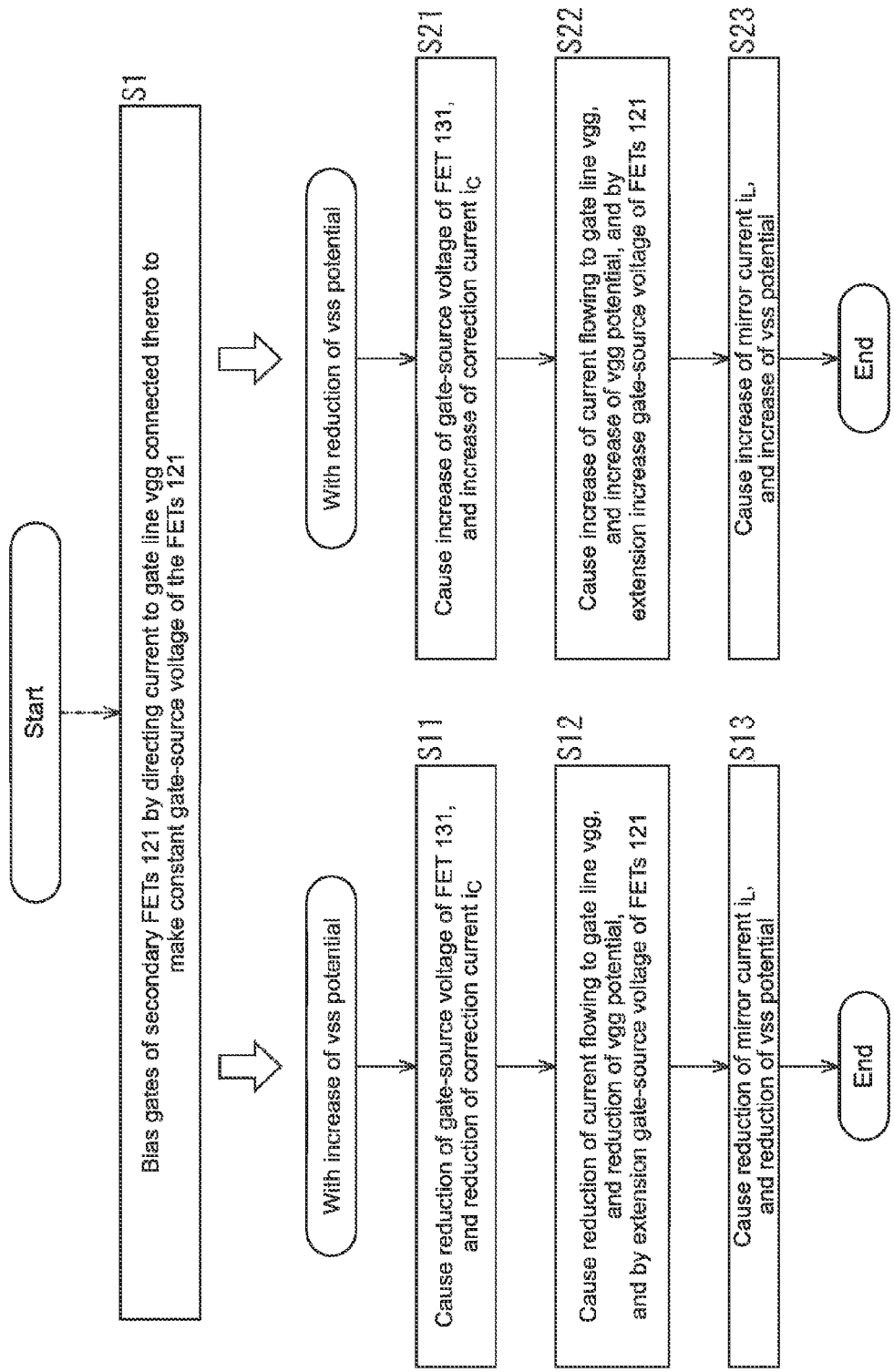
FIG. 9 is an operation flowchart of the current mirror.

FIG. 9 is an operation flowchart of the current mirror 53 of FIG. 8.

In step S1, in the bias amplifier 130, the FET 131 is provided with a current corresponding to the mirror current $i_L$. The mirror current $i_L$ is one flowing in the proximal load FET 121 in close vicinity to the correction point where the bias amplifier 130 is placed.

The current flowing in the FET 131 is reversed in direction at the FETs 132 and 133 configuring the current mirror, and then is fed to the gate line vgg as the correction current $i_C$. After reaching the gate line vgg, the correction current $i_C$ flows through the gate line vgg as the vgg current, and then is drawn out from the FET 104 (114) being a draw-out circuit to the GND terminal(s).

With the correction current $i_C$ flowing to the gate line vgg as above, the gate line vgg, and by extension the gates of the X FETs 121 are so biased as to make constant the gate-source voltage (the voltage between the gate line vgg and the GND line vss) of the X FETs 121.

Thereafter, when the vss potential on the GND line vss is increased due to one variation factor or another, for example, in step S11, the FET 131 in the bias amplifier 130 shows a reduction of gate-source voltage. As a result, the correction current $i_C$ coming from the bias amplifier 130 is reduced.

In step S12, the reduction of the correction current $i_C$ causes a reduction of the vgg current flowing to the gate line vgg so that the vgg potential, and by extension the gate-source voltage is reduced in the load FETs 121. In step S13, the reduction of the gate-source voltage in the FETs 121 causes a reduction of the mirror current $i_L$ so that the vss current flowing to the GND line vss is reduced.

Due to the reduction of the vss current flowing to the GND line vss, the vss potential having been increased due to some variation factor is reduced so that the voltage between the gate line vgg and the GND line vss, i.e., the gate-source voltage of the FETs 121, remains constant.

On the other hand, when the vss potential on the GND line vss is reduced due to one variation factor or another, in step S21, the gate-source voltage of the FET 131 in the bias amplifier 130 is increased. As a result, the correction current $i_C$ coming from the bias amplifier 130 is increased.

In step S22, the increase of the correction current $i_C$ causes an increase of the vgg current flowing to the gate line vgg so that the vgg voltage, and by extension the gate-source voltage of the load FETs 121 is increased.

In step S23, the increase of the gate-source voltage of the FETs 121 causes an increase of the mirror current $i_L$ so that the vss current flowing to the GND line vss is increased.

Due to the increase of the vss current flowing to the GND line vss, the vss potential having been reduced due to some variation factor is increased so that the voltage between the gate line vgg and the GND line vss, i.e., the gate-source voltage of the FETs 121, remains constant.

As described above, in the current mirror 53, the bias amplifier 130 feeds the correction current $i_C$ to the gate line vgg that connects together the gates of the X load FETs 121, thereby biasing the gate line vgg so as to make constant the gate-source voltage of the X FETs 121. This thus reduces any influence of the GND-potential spatial distribution on the GND line vss.

[Second Exemplary Configuration of Bias Amplifier 130]

Figure 10:
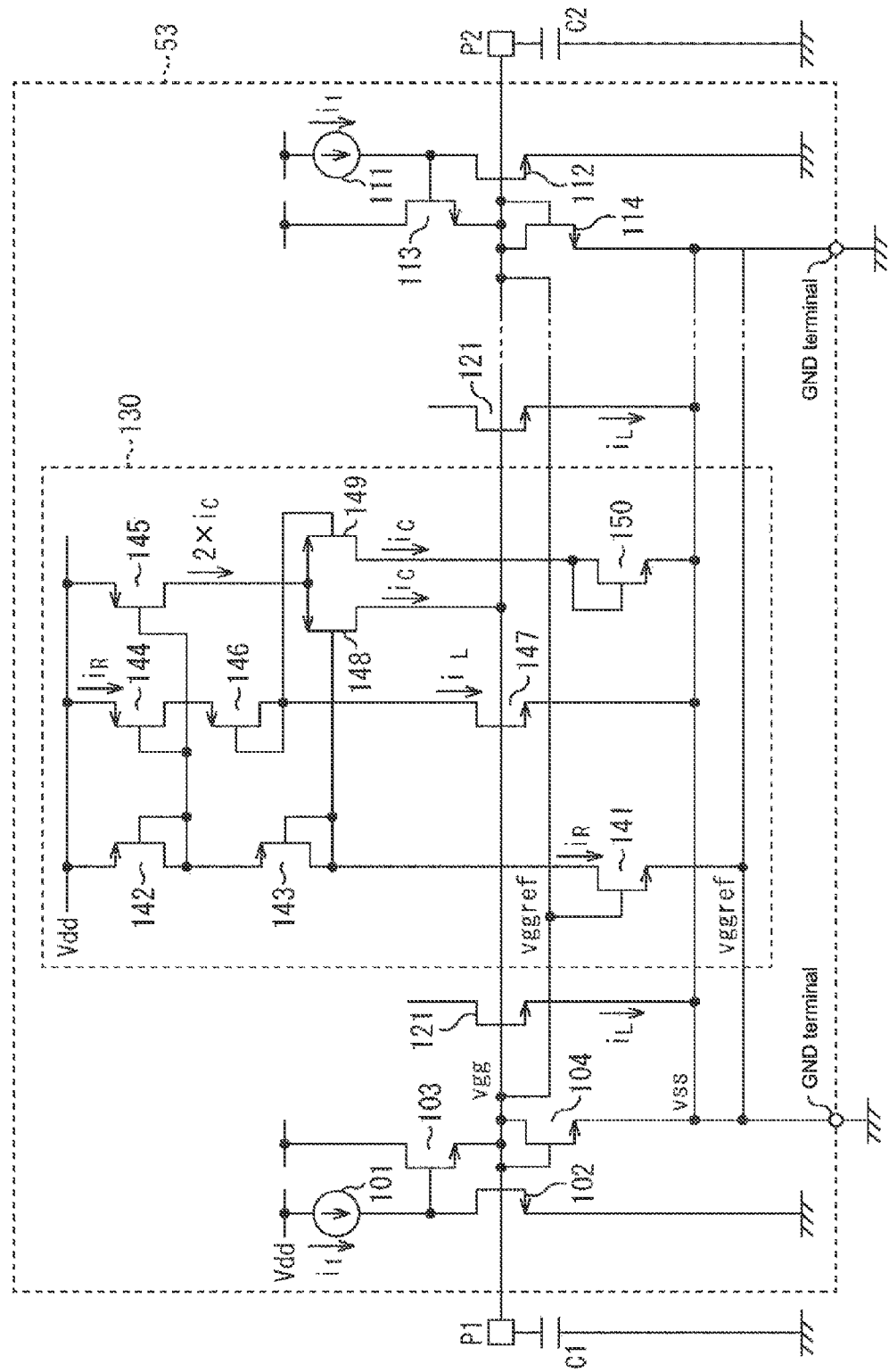
FIG. 10 is a circuit diagram showing a second exemplary configuration of the bias amplifier.

FIG. 10 is a circuit diagram showing a second exemplary configuration of the bias amplifier 130 of FIG. 6.

When light entering the image sensor 2 is large in amount, this causes a great reduction of the VSL voltage of the VSLs 42 (FIG. 4), and by extension the drain voltage of the FETs 121 connected to the VSLs 42. As a result, the FETs 121 may operate in an unsaturation region.

As to the FETs 121 operating in the unsaturation region, the mirror current $i_L$ flowing therein is reduced, whereby the vss potential is reduced.

When the vss potential is reduced, as described in steps S21 and S23 of FIG. 9, the bias amplifier 130 increases the correction current $i_C$. This thus increases the vgg potential on the gate line vgg to which the correction current $i_C$ is fed, and the gate-source voltage of the FETs 121 is increased.

As a result, the mirror current $i_L$ flowing in the FETs 121 is increased, thereby recovering the vss potential that has been reduced.

When some of the X FETs 121 operate in the unsaturation region, and when the remaining FETs 121 operate in a saturation region, the increase of the vgg potential, i.e., the increase of the gate-source voltage, causes an increase of the mirror current $i_L$ in the FETs 121 operating in the saturation region, but the mirror current $i_L$ shows almost no change in the FETs 121 operating in the unsaturation region.

Because the mirror current $i_L$ of the FETs 121 operating in the unsaturation region shows almost no change as above, the mirror current $i_L$ of the FETs 121 operating in the saturation region instead shows a great increase.

What is considered now is a horizontal line in the image sensor 2, for example. In the horizontal line, when the image at the center portion is black and the image in the remaining portion is white, the FETs 121 corresponding to the center portion with the black image (image with the less amount of light) may operate in the saturation region, and the FETs 121 corresponding to the remaining portion with the white image (image with the large amount of light) may operate in the unsaturation region.

In such a case, when the mirror current $i_L$ is greatly increased as described above in the FETs 121 operating in the saturation region, the black image at the center becomes grayish as is increased in brightness. As a result, an image captured by the image sensor 2 is with a pattern that looks unnatural.

The bias amplifier 130 of FIG. 10 biases the gate line vgg so as to prevent the mirror current $i_L$ from greatly increasing only for the FETs 121 operating in the saturation region as described above, for example.

That is, the bias amplifier 130 of FIG. 10 biases the gate line vgg similarly to that of FIG. 8, i.e., biases the gate line vgg to make constant the gate-source voltage of the FETs 121 by feeding the correction current $i_C$ to the gate line vgg.

However, for making constant the gate-source voltage of the FETs 121, the bias amplifier 130 of FIG. 10 operates differently from that of FIG. 8 when the vss potential varies. That is, as described by referring to FIG. 9, the bias amplifier 130 of FIG. 8 biases the gate line vgg to vary the mirror current $i_L$ flowing in the FETs 121 so as to prevent the vss potential from varying.

On the other hand, the bias amplifier 130 of FIG. 10 biases the gate line vgg to make the vgg potential respond to the varying vss potential so that the mirror current $i_L$ flowing in the FETs 121 is controlled not to vary.

In FIG. 10, the current mirror 53 additionally includes a gate reference line vggref, and a GND reference line vssref compared with that of FIG. 8 (FIG. 6).

Similarly to the gate line vgg, the gate reference line vggref is a conductor line with a uniform width, and is provided to be parallel to the gate line vgg. The end portions of the gate reference line vggref are respectively connected to connection points between the gate line vgg and the FETs 104 and 114.

Similarly to the GND line vss, the GND reference line vssref is a conductor line with a uniform width, and is provided to be parallel to the GND line vss. The end portions of the GND reference line vssref are respectively connected to the end portions of the GND line vss.

The gate reference line vggref and the GND reference line vssref are both not expected to be so thick. However, the GND reference line vssref may desirably be slightly thick considering the amount of current flowing thereinto.

Moreover, in terms of AC (Alternating Current), the gate reference line vggref and the GND reference line vssref are coupled desirably tightly, and are positioned desirably close to each other.

The gate reference line vggref and the GND reference line vssref are for providing the bias amplifiers 130 in the entire current mirror 53 with a constant potential difference irrespective of the variations in the vss potential.

In FIG. 10, the bias amplifier 130 includes FETs 141, 142, 143, 144, 145, 146, 147, 148, 149, and 150.

The FET 141 (another first FET) is an nMOS FET, and the gate thereof is connected to the gate reference line vggref, the source thereof is connected to the GND reference line vssref, and the drain thereof is connected to the drain of the FET 143.

The FET 141 configures another current mirror (different from the current mirror 53) in which driver components are the same as those in the current mirror 53, i.e., the current source 101, and the FETs 102 to 104, and a load component is the FET 141.

The FET 142 is a pMOS FET, and the gate thereof is connected to the drain, the source thereof is connected to the power supply Vdd, and the drain thereof is connected to the source of the FET 143.

Also in the FET 142, the gate is connected also to the gates of the FETs 145 and 146, and the FET 142 being a driver component configures a current mirror with the FETs 145 and 146 each being a load component.

The FET 143 is a pMOS FET, and the gate thereof is connected to the drain, and the connection point between the gate and the drain is connected to the gate of the FET 148. The FET 143 is for ensuring the drain-source voltage of the FET 145.

The FET 144 is a pMOS FET, and the source thereof is connected to the power supply Vdd, and the drain thereof is connected to the source of the FET 146. As described above, the FET 144 configures a current mirror with the FET 142.

The FET 145 is a pMOS FET, and the source thereof is connected to the power source Vdd, and the drain thereof is connected to both the sources of the FETs 148 and 149. As described above, the FET 145 configures the current mirror with the FET 142.

The FET 146 is a pMOS FET, and therein, the gate and the drain are connected, and the connection point therebetween is connected to both the drain of the FET 147 and the gate of the FET 149.

The FET 146 is for equating the drain-source voltage in the FETs 141 and 147, and for equating the drain-source voltage in the FETs 142, 144, and 145.

That is, when the drain-source voltage in the FET 146 is equated with the drain-source voltage in the FET 143, this equates the drain-source voltage in the FETs 141 and 147, and equates the drain-source voltage in the FETs 142, 144, and 145.

The FET 146 is not necessarily provided in the bias amplifier 130, but including the FET 146 may improve the mirror accuracy in the resulting current mirror 53. The bias amplifier 130 thus desirably includes the FET 146.

The FET 147 (another second FET) is an nMOS FET, and the gate thereof is connected to the gate of the load FETs 121 via the gate line vgg, and the source thereof is connected to the source of the load FET 121 via the GND line vss.

The FETs 148 and 149 are each a pMOS FET, and configure a differential pair with a connection between their sources. The drain of the FET 148 is connected to the gate line vgg, and the drain of the FET 149 is connected to the drain of the FET 150.

The FET 150 is an nMOS FET, and the gate thereof is connected to the drain, and the source thereof is connected to the GND line vss.

In the bias amplifier 130 configured as above, the FET 141 operates with the gate-drain voltage, which is a constant potential difference between the gate reference line vggref and the GND reference line vssref. As a result, the FET 141 is provided with a constant current $i_R$ (the drain current thereof).

The constant current $i_R$ flowing in the FET 141 is reversed in direction in the current mirror configured by the FETs 142 and 144, and as a result, the FET 144 is provided with a current corresponding to the constant current $i_R$, e.g., the constant current $i_R$ (a current equal thereto).

The FET 147 is provided with the gate-source voltage same as that of the load FETs 121 via the gate line vgg and the GND line vss. The FET 147 is thus provided with a current proportional to the mirror current $i_L$ flowing in the load FETs 121, i.e., $i_L'=a \times i_L$.

In the above equation, "a" representing the current flowing in the FET 147, i.e., $i_L'=a \times i_L$, is a constant. For simplicity, assuming that "a"=1, the FET 147 is provided with a current $i_L'=i_L$, which is equal to the mirror current $i_L$ flowing in the load FETs 121.

As described above, the FET 144 is provided with the constant current $i_R$, and the FET 147 is provided with the current $i_L'$ being equal to the mirror current $i_L$. Therefore, at the drain of the FET 146 located between the FETs 144 and 147, a voltage is generated, i.e., voltage corresponding to a difference between the constant current $i_R$ flowing in the FET 144 and the current $i_L'=i_L$ flowing in the FET 147, i.e., $i_R-i_L'$.

The voltage corresponding to such a difference $i_R-i_L'$ is applied to the gate of the FET 149. In response thereto, the correction current $i_C$ corresponding to the difference $i_R-i_L'$ is fed to the FETs 148 and 149 configuring the differential pair.

The correction current $i_C$ flowing in the FET 148 is fed to the gate line vgg. In response thereto, the FET 148 biases the gate line vgg so as to obtain 0 for the difference $i_R-i_L'$, that is, to equate the current $i_L'$ corresponding to the mirror current $i_L$ with the constant current $i_R$.

As described above, in the bias amplifier 130 of FIG. 10, the differential pair being the FETs 148 and 149 feeds the correction current $i_C$ to the gate line vgg so as to provide the FET 147 with the current $i_L'$ corresponding to the constant current $i_R$ flowing in the FET 141, i.e., the current $i_L'$ equal to the constant current $i_R$. This leads to feedback to bias the gate line vgg so as to make constant the gate-source voltage in the FETs 121.

When the vss potential on the GND line vss is increased, for example, the gate-source voltage of the FETs 121 is reduced so that the mirror current $i_L$ is reduced. In response to the reduction of the mirror current $i_L$, the current $i_L$ in the FET 147 equal to the mirror current $i_L$ is also reduced so that a difference from the constant current $i_R$, i.e., $i_R-i_L'$, is increased.

In response to the increase of the difference $i_R-i_L'$, the gate voltage of the FET 149 is increased, thereby increasing the correction current $i_C$ coming from the FET 148 being the differential pair with the FET 149.

The increase of the correction current $i_C$ increases the gate potential vgg on the gate line vgg to which the correction current $i_C$ is fed. This increases the gate-source voltage of the FETs 121 that has been reduced due to the increase of the vss potential on the GND line, i.e., obtains the original gate-source voltage. This also increases the mirror current $i_L$ that has been reduced, i.e., obtains the original mirror current $i_L$.

In FIG. 10, the GND reference line vssref is provided with the constant current $i_R$ from the FET 141. The flow of the constant current $i_R$ causes a voltage reduction so that the potential on the GND reference line vssref is increased as the GND reference line vssref is spatially away from the GND terminal(s).

Therefore, a potential difference between the gate reference line vggref and the GND reference line vssref is somewhat affected by their positional relationship.

For making constant a potential difference between the gate reference line vggref and the GND reference line vssref irrespective of their positions, for example, the gate reference line vggref and the GND reference line vssref may be made to have the same thickness, and the current mirror 53 may be provided with an additional circuit. The additional circuit is for providing the gate reference line vggref with a current equal to the constant current $i_R$ coming from the FET 141.

However, such an additional circuit may be a variation factor for the constant current $i_R$, and may affect the current mirror 53 to be unstable. In consideration thereof, the constant current $i_R$ (and the constant "a") may be small in value. This may control a potential difference between the gate reference line vggref and the GND reference line vssref not to be affected by their positional relationship. This accordingly eliminates having to include the additional circuit in the current mirror 53 as above.

As described above, the bias amplifiers 130 in the first and second exemplary configurations may correct (compensate) the vgg potential to reduce any influence of the GND potential (vss potential) in the large-load current mirror 53.

With the vgg potential corrected by the bias amplifiers 130, the layout area may be reduced by a thinner GND line vss. How much layout area is to be reduced thereby may be much larger than the area expected for use to implement the bias amplifiers 130.

The bias amplifier 130 in the second exemplary configuration biases the gate line vgg to make the vgg potential respond to the varying vss potential, thereby controlling the mirror current $i_L$ not to vary in the FETs 121 to make constant the gate-source voltage therein. Therefore, as described above, images to be captured may not be with a pattern looking unnatural, which is a phenomenon when the mirror current $i_L$ is greatly increased only in the FETs 121 operating in the saturation region.

The bias amplifier 130 in the second exemplary configuration is effective when the vss potential varies, e.g., when current control (load-MOS boosting) is performed to temporarily increase the amount of current (load-MOS current) to be drawn out from the VSLs 42 (FIG. 4) at the time of reading of electric signals from pixels. This current control is performed to deal with the high-speed reading of electric signals from pixels, for example.

While the present disclosure has been described in detail, the foregoing description is in all aspects illustrative and not restrictive. It is understood that numerous other modifications and variations can be devised without departing from the scope of the present disclosure.

For example, when the current mirror 53 is formed by pMOS FETs, by replacing the words of "power supply" and "GND" with each other in the above description on the current mirror 53 formed by nMOS FETs, the influence of the spatial distribution of power supply potential is reduced.

Further, though a general current mirror using nMOS FETs is based on the GND potential (vss potential), and a general current mirror using pMOS FETs is based on the power supply potential (Vdd potential), it is also possible that the current mirror is based on virtual GND or power supply, for example.

Still further, other than being applied to the current source I configuring an SF circuit with the amplifier Tr 64 in the image sensor 2, the current mirror 53 is applicable also to current sources in comparators configuring an ADC for so-called single-slope AD conversion, or a current source configuring a current-summing DAC, for example.

The present disclosure is applicable not only to the image sensor but also to a device with a current mirror including a plurality of load FETs.

The effects described in this Specification are in all aspects illustrative and not restrictive, and numerous other effects may be possible.

The present disclosure may be also in the following structures.

(1) A current mirror, including
at least one bias amplifier configured to adjust a gate line voltage by feeding currents to the gate line to make constant gate-source voltages of a plurality of FETs (Field Effect Transistors), the gate line connecting gates of the FETs each being a load component in the current mirror.
(2) The current mirror according to (1), in which
the number of the at least one bias amplifier is at least one and less than the number of the load FETs.
(3) The current mirror according to (1) or (2), in which
the at least one bias amplifier includes
another FET configured to provide a current corresponding to a mirror current, the mirror current flowing in the load FETs, and
a direction-reversing current mirror configured to reverse a direction of the current flowing in the other FET, the current being fed to the gate line.
(4) The current mirror according to any one of (1) to (3), further including
a draw-out circuit configured to draw out the current flowing to the gate line, in which
the draw-out circuit is provided to every GND (ground) terminal or to every power supply terminal in the current mirror.
(5) The current mirror according to (4), in which
an SF (Source Follower) FET drives the current mirror.
(6) The current mirror according to (5), in which
a current source of the SF FET serves also as the draw-out circuit.
(7) The current mirror according to (1) or (2), in which
the at least one bias amplifier includes
another first FET forming another current mirror with the same driver of the current mirror, another second FET in which a gate and a source are respectively connected to gates and sources of other load FETs, and
a differential pair configured to provide a current to the gate line so that the same current corresponding to the first FET flows into the second FET.
(8) The current mirror according to any one of (1) to (7), in which
the load FETs are each a current source for an amplifier transistor, the amplifier transistor configuring an SF in a pixel unit in an image sensor.
(9) A current mirror control method, including:
adjusting a gate line voltage by feeding currents to the gate line to make constant gate-source voltages of a plurality of FETs, the gate line connecting gates of the FETs each being a load component in the current mirror.
(10) An image sensor, including:
a pixel unit performing photoelectric conversion; and
a current mirror,
the current mirror including
a plurality of load FETs each being a current source for an amplifier transistor, the amplifier transistor configuring an SF in the pixel unit, and
at least one bias amplifier configured to adjust a gate line voltage by feeding currents to the gate line to make constant gate-source voltages of a plurality of FETs, the gate line connecting gates of the FETs each being a load component in the current mirror.

It should be understood by those skilled in the art that various modifications, combinations, sub-combinations and alterations may occur depending on design requirements and other factors insofar as they are within the scope of the appended claims or the equivalents thereof.

What is claimed is:
1. A current mirror, comprising
at least one bias amplifier configured to adjust a gate line voltage by feeding currents to a gate line to make constant gate-source voltages of a plurality of FETs (Field Effect Transistors), the gate line connecting gates for the plurality of FETs,
wherein the plurality of FETs are load FETs so that each FET is a load component in the current mirror,
wherein the number of the at least one bias amplifier is at least one and less than the number of the load FETs, and
wherein the at least one bias amplifier includes,
another first FET configured to provide a current corresponding to a mirror current, the mirror current flowing in the load FETs, and
a direction-reversing current mirror configured to reverse a direction of the current flowing in the another first FET and feed the reversed current to the gate line.
2. The current mirror according to claim 1, further comprising:
a draw-out circuit configured to draw out the current flowing to the gate line, wherein
the draw-out circuit is provided to every GND (ground) terminal or to every power supply terminal in the current mirror.
3. The current mirror according to claim 2, wherein
an SF (Source Follower) FET drives the current mirror.
4. The current mirror according to claim 3, wherein
a current source of the SF FET serves also as the draw-out circuit.

5. The current mirror according to claim 1, wherein the another first FET has a same driver as the current mirror, and wherein the at least one bias amplifier includes,
- another second FET in which a gate and a source are respectively connected to gates and sources of the load FETs, and
- a differential pair of FETs configured to provide a current to the gate line so that a same current corresponding to the another first FET flows into the another second FET.

6. The current mirror according to claim 1, wherein the load FETs are each a current source for an amplifier transistor, the amplifier transistor configuring an SF in a pixel unit in an image sensor.

7. A current mirror control method, comprising:
adjusting, by at least one bias amplifier, a gate line voltage by feeding currents to a gate line to make constant gate-source voltages of a plurality of FETs, the gate line connecting gates of the plurality of FETs,
 wherein the plurality of FETs are load FETs so that each FET is a load component in the current mirror,
 wherein the number of the at least one bias amplifier is at least one and less than the number of the load FETs, and
 wherein the at least one bias amplifier includes another FET and a direction-reversing current mirror;
providing, by the another FET, a current corresponding to a mirror current, the mirror current flowing in the load FETs; and
reversing, by the direction-reversing current mirror, a direction of the current flowing in the another FET and feeding the reversed current to the gate line.

8. An image sensor, comprising:
a pixel unit to perform photoelectric conversion; and
a current mirror including:
 a plurality of load FETs each being a current source for an amplifier transistor, the amplifier transistor configuring an SF (source follower) in the pixel unit; and
 at least one bias amplifier configured to adjust a gate line voltage by feeding currents to a gate line to make constant gate-source voltages of a plurality of FETs, the gate line connecting gates for the plurality of FETs,
wherein the plurality of FETs are load FETs so that each FET is a load component in the current mirror,
wherein the number of the at least one bias amplifier is at least one and less than the number of the load FETs, and
wherein the at least one bias amplifier includes,
 another first FET configured to provide a current corresponding to a mirror current, the mirror current flowing in the load FETs, and
 a direction-reversing current mirror configured to reverse a direction of the current flowing in the another first FET and feed the reversed current to the gate line.

* * * * *